(12) United States Patent
Ikeda et al.

(10) Patent No.: US 9,633,818 B2
(45) Date of Patent: Apr. 25, 2017

(54) CHARGED PARTICLE BEAM APPARATUS, IMAGE FORMING METHOD USING A CHARGED PARTICLE BEAM APPARATUS, AND IMAGE PROCESSING APPARATUS

(71) Applicant: Hitachi High-Technologies Corporation, Minato-ku, Tokyo (JP)

(72) Inventors: Kazuki Ikeda, Tokyo (JP); Wen Li, Tokyo (JP); Hajime Kawano, Tokyo (JP); Hiroyuki Takahashi, Tokyo (JP); Makoto Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/041,873

(22) Filed: Feb. 11, 2016

(65) Prior Publication Data
US 2016/0276128 A1    Sep. 22, 2016

(30) Foreign Application Priority Data

Mar. 20, 2015   (JP) .................................. 2015-058593

(51) Int. Cl.
*H01J 37/26*     (2006.01)
*H01J 37/28*     (2006.01)
(Continued)

(52) U.S. Cl.
CPC .......... *H01J 37/222* (2013.01); *H01J 37/244* (2013.01); *H01J 37/28* (2013.01);
(Continued)

(58) Field of Classification Search
USPC ............... 250/306, 307, 309–311, 318, 319, 250/582–584, 586, 492.1, 492.2, 492.21,
(Continued)

(56) References Cited

U.S. PATENT DOCUMENTS 5,020,124 A * 5/1991 D'Aoust .................... G06T 1/20
                                                        382/172
5,093,871 A * 3/1992 Klein ......................... G06T 1/20
                                                        382/172
(Continued)

FOREIGN PATENT DOCUMENTS

JP          8-62274 A      3/1996
JP       2011-175811 A     9/2011
WO   WO 2013/187511 A1   12/2013

*Primary Examiner* — Bernard Souw
(74) *Attorney, Agent, or Firm* — Crowell & Moring LLP

(57) ABSTRACT

To provide a charged particle beam apparatus capable of obtaining an image with high contrast and high visibility, the apparatus has: a charged particle optical system; a detection part to detect secondary charged particles generated from the sample; an image formation part to receive a detection signal from the detection part and form an image of the sample; an image processing part to process the image formed with the image formation part; and a display part to display the result of processing with the image processing part, wherein the image formation part has a pulse-count signal processing part to generate cumulative histogram information on a pulse signal component in the detection signal, set a threshold value for pulse signal detection using information on the generated cumulative histogram, and output a detection signal having a value higher than the set threshold value as a pulse signal.

13 Claims, 8 Drawing Sheets

(51) Int. Cl.
    *H01J 37/244*    (2006.01)
    *H01J 37/22*     (2006.01)
(52) U.S. Cl.
    CPC . *H01J 2237/221* (2013.01); *H01J 2237/2448* (2013.01); *H01J 2237/2817* (2013.01)
(58) Field of Classification Search
    USPC .............................................. 250/492.3, 526
    See application file for complete search history.

(56)                References Cited

U.S. PATENT DOCUMENTS

| | | | | |
|---|---|---|---|---|
| 5,315,409 | A * | 5/1994 | Matsumura | G06K 9/38 |
| | | | | 358/448 |
| 6,504,628 | B1 * | 1/2003 | Kanno | H04N 1/56 |
| | | | | 358/515 |
| 8,481,980 | B2 * | 7/2013 | Shichi | H01J 27/10 |
| | | | | 250/288 |
| 8,779,400 | B2 * | 7/2014 | Shichi | H01J 27/10 |
| | | | | 250/492.1 |
| 9,183,656 | B2 * | 11/2015 | Howell | G06T 11/60 |
| 2009/0230299 | A1 * | 9/2009 | Shichi | H01J 27/10 |
| | | | | 250/282 |
| 2014/0117231 | A1 * | 5/2014 | Owen | H01J 37/28 |
| | | | | 250/307 |
| 2015/0153223 | A1 * | 6/2015 | Onishi | G01J 1/42 |
| | | | | 250/214 A |
| 2016/0063749 | A1 * | 3/2016 | Howell | G06T 11/60 |
| | | | | 250/310 |
| 2016/0064182 | A1 * | 3/2016 | Ikeda | H01J 37/244 |
| | | | | 250/307 |

\* cited by examiner

F I G. 1
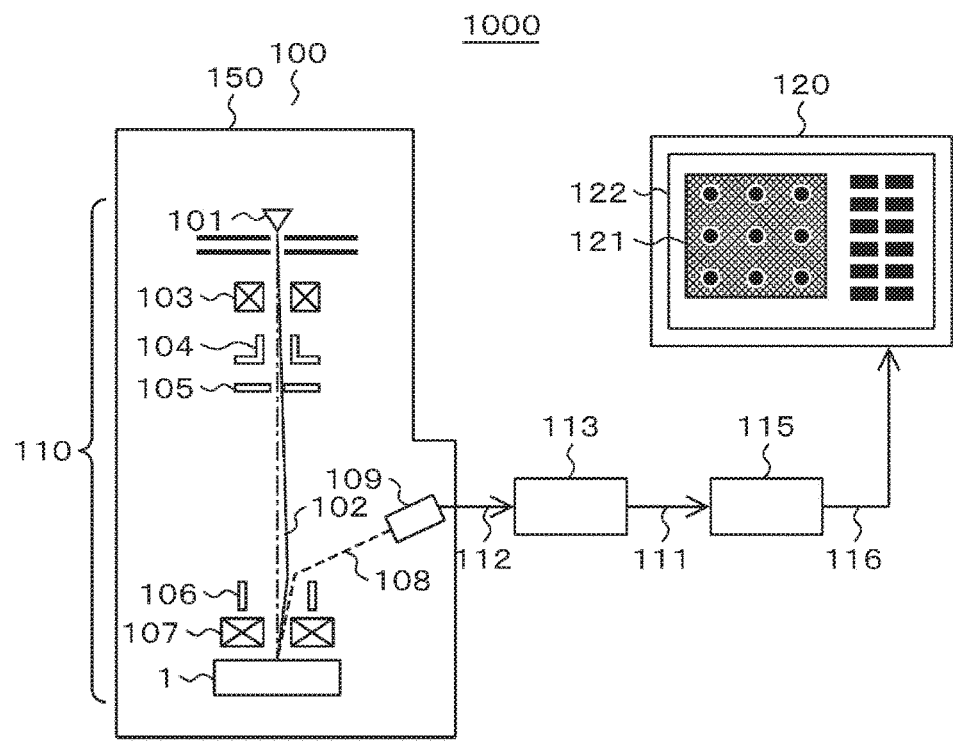
F I G. 2
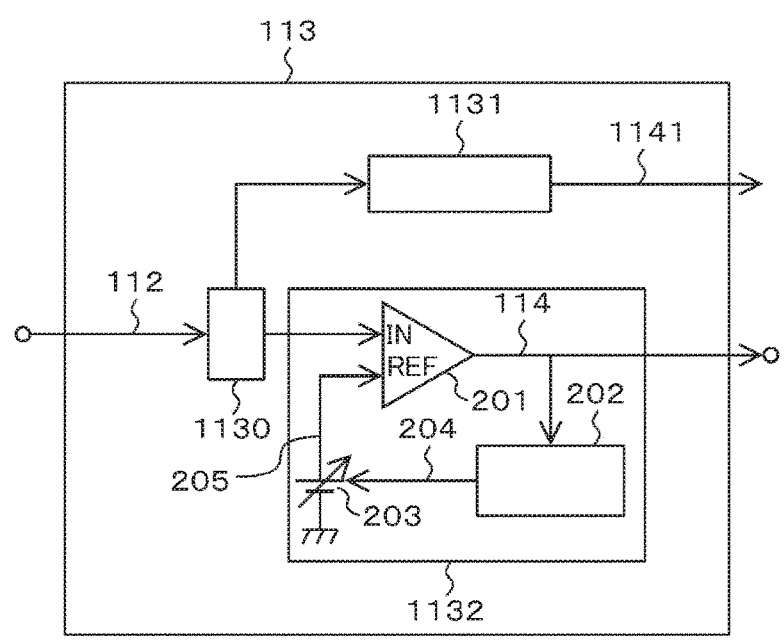

F I G. 3 A
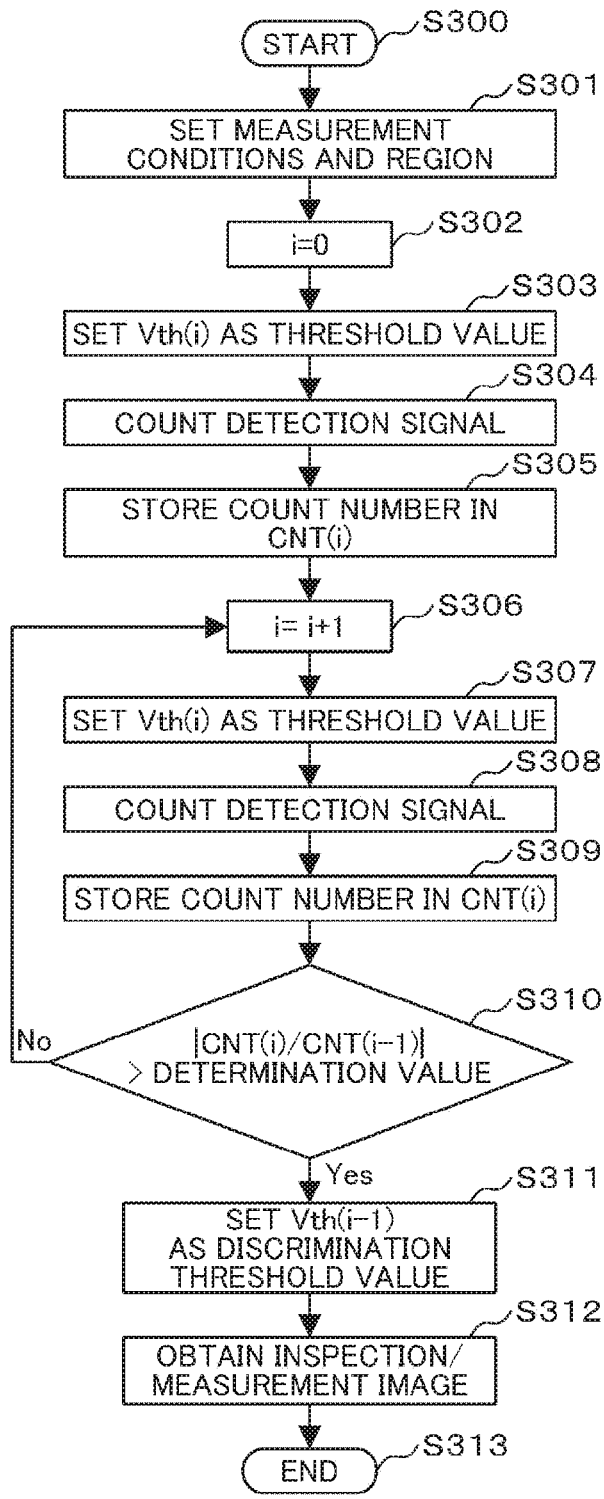

| i | Vth(i) |
|---|--------|
| 0 | 1.5(V) |
| 1 | 1.4(V) |
| 2 | 1.3(V) |
| 3 | 1.2(V) |
| 4 | 1.1(V) |
| 5 | 1.0(V) |
| ⋮ | ⋮ |

320

F I G. 7
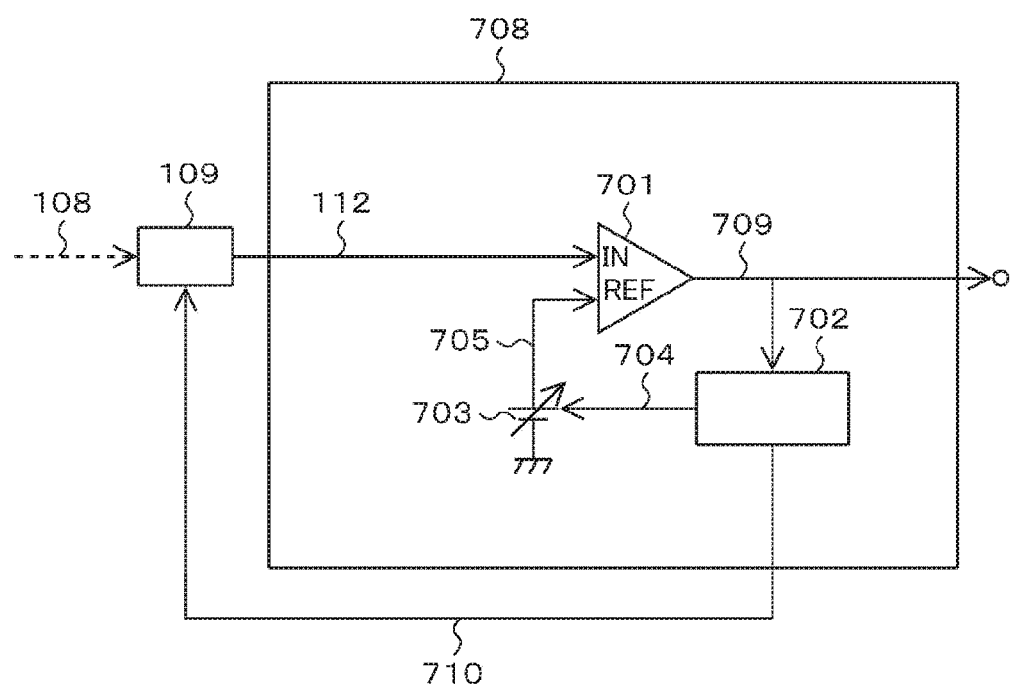

| i | Vth(i) |
|---|---|
| 0 | 1.5(V) |
| 1 | 1.4(V) |
| 2 | 1.3(V) |
| 3 | 1.2(V) |
| 4 | 1.1(V) |
| 5 | 1.0(V) |
| ⋮ | ⋮ |

| j | Gain(j) |
|---|---|
| 0 | 1.2(kV) |
| 1 | 1.1(kV) |
| 2 | 1.0(kV) |
| 3 | 0.9(kV) |
| 4 | 0.8(kV) |
| 5 | 0.7(kV) |
| ⋮ | ⋮ |

F I G. 9
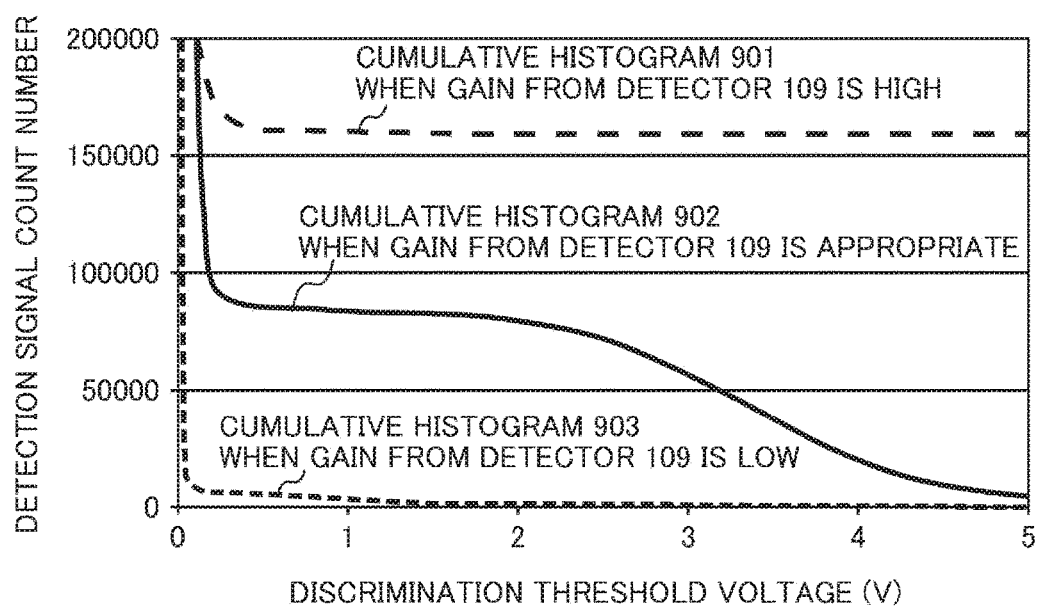

CHARGED PARTICLE BEAM APPARATUS, IMAGE FORMING METHOD USING A CHARGED PARTICLE BEAM APPARATUS, AND IMAGE PROCESSING APPARATUS

BACKGROUND

The present invention relates to a charged particle beam apparatus for performing measurement, observation or inspection on a fine pattern formed on a sample, an image forming method using the charged particle beam apparatus, and an image processing apparatus.

In a charged particle beam apparatus to perform measurement, observation or inspection on a fine pattern formed on a sample, a detector having a combination of a scintillator and a photomultiplier tube is employed to detect secondary charged particles which is generated when the sample is irradiated with a charged particle beam. When miniaturization of the pattern as the subject of the measurement, observation or inspection is further advanced, the amount of secondary charged particles which is generated when the sample is irradiated with the charged particle beam is reduced, and the secondary charged particles are discretely incident on the detector. As a result, the detector that has detected such secondary charged particles outputs a pulse-type signal.

As a method of processing the pulse signal outputted from the detector, pulse counting is known. As prior techniques related to the pulse counting, International Patent Publication WO2013/187511, Japanese Unexamined Patent Application Publication No. Hei 08-062274 and Japanese Unexamined Patent Application Publication No. 2011-175811 are known.

International Patent Publication WO2013/187511 discloses "to provide an optical signal detecting circuit, light volume detecting device, and charged particle beam device capable of discriminating, with a simple operation, the signal component of an extremely small amount of light and the signal noise component caused by dark current. A data processor (441) obtains a peak value, which is the maximum voltage value of a pulse, by detecting the pulse from a digital voltage signal that corresponds to an amount of light converted by an amplifier (41) and an A/D converter (42), and stores the occurrence frequency for each found peak value in a frequency storage area (451); a data analyzer (442) compares the occurrence frequencies of the peak values associated with the peak values stored in the frequency storage area (451), sequentially from the smallest value, with a predetermined lower frequency limit, and sets the peak value for which the occurrence frequency is less than or equal to the lower frequency limit as the comparison result, as a pulse determination threshold value; and a threshold value processor (43) outputs a digital voltage signal equal to or greater than the pulse determination threshold value as a detection signal".

Japanese Unexamined Patent Application Publication No. Hei 08-062274 discloses as follows: "an input is compared with a threshold value Vth in a comparator 2. A threshold-value setting circuit 1 determines the threshold value Vth at any time. The comparator 2 generates a reading signal 3 for an input Vj exceeding the threshold value Vth. The threshold value Vth is changed in correspondence with the magnitude and the frequency of the input signal so that the number of the input signals equal to or greater than the threshold value Vth in the unit time is always contained in the certain range. When the noise level is low, the threshold value Vth becomes low, and the value is measured through the low noise level. Therefore, it is found that the measuring instrument is not defective. When the noise is large, the threshold value Vth is increased, so as to suppress input of noise. Even in this case, it is possible to measure the signal of the partial discharge without omission".

Japanese Unexamined Patent Application Publication No. 2011-175811 describes a charged particle beam device which "includes a determiner for determining whether an output signal is an output signal in the condition that one charged particle is incident on a detector or the output signal is an output signal in the condition that a plurality of charged particles are incident on the detector; and an operation unit for performing image formation with signal processing based on a pulse count method when it is determined that the output signal is an output signal in the condition that one charged particle is incident on the detector, and performing the image formation with signal processing based on an analog method when it is determined that the output signal is an output signal in the condition that the plurality of charged particles are incident on the detector".

SUMMARY

In a semiconductor manufacturing process, miniaturization of circuit pattern formed on a semiconductor substrate (wafer) is rapidly advanced. The significance of process monitoring as to whether or not the patterns are formed as designed is further increased. For example, to detect occurrence of abnormality or fault (defect) in the semiconductor manufacturing process at an early stage or in advance, measurement and inspection are performed on a circuit pattern or the like on the wafer upon completion of each manufacturing process.

Upon measurement and inspection, in a measurement/inspection device such as an electron microscope using scanning electron beam (SEM) and a corresponding measurement/inspection method, an electron beam (electron ray) is emitted while it is being scanned with respect to a wafer (sample) as a subject, and energy of secondary electrons and reflection electrons caused by the irradiation is detected. Then an image (measurement image or inspection image) is formed by signal processing/image processing based on the result of detection. Then measurement, observation or inspection is performed based on the image.

For example, the inspection images are used in the case of a device (inspection device or inspection function) to perform defect inspection on a circuit pattern. Images of the same circuit pattern are compared, and a portion of large difference is determined and detected as a defect. Further, in the case of a device (measurement device or measurement function) to perform measurement on a circuit pattern, since the amount of occurrence of secondary electrons and reflection electrons changes in accordance with irregularity (surface shape) of the sample, it is possible to obtain changes of the surface shape of the sample by estimation of the signal of the secondary electrons or the like. Especially, it is possible, by utilizing radical increment/decrement of the signal of the secondary electrons or the like at an edge of the circuit pattern, to measure a size value of the circuit pattern by estimating an edge position of the circuit pattern in the image. Then it is possible to estimate whether the circuit pattern process is good or not good based on the result of measurement. Further, in the case of a device (review device) to perform detailed observation on a defect detected with another inspection device, a defect position is detected in a low magnification secondary electron image based on the position coordinates of the defect detected with the other inspection device. Then an enlarged image of the defect is obtained as a high magnification secondary electron image. In the enlarged image, the defect is observed, a feature value of the defect on the image is extracted from the enlarged image, and the defect is classified.

The method of electron beam scanning in the conventional measurement/inspection device such as an SEM and the conventional measurement/inspection method will be described below. For example, general scanning in a CD-SEM (Critical Dimension-Scanning Electron Microscope) is referred to as TV scanning or raster scanning. Further, n-time speed scanning with reference to the TV scanning is referred to as n-time speed scanning. In the conventional raster scanning or TV scanning, there is a problem that a sample charge amount differs in accordance with scan direction or scan speed of the electron beam and size or shape of pattern formed on the sample. That is, in an image obtained by detecting secondary electrons, the image contrast may be lowered or the edges of circuit pattern may disappear by such difference in sample charge amount. In this case, the accuracy of the observation or inspection of the sample surface state is lowered or the observation or inspection is impossible. Such phenomena become more obvious in accordance with miniaturization of size of a pattern as an inspection subject.

As a countermeasure against the degradation of the accuracy of measurement/inspection, it is effective to shorten a period of electron-beam irradiation per unit region. That is, it is effective to reduce the irradiation charge density and reduce the charge amount of the sample or control the amount to an appropriate value. In order to implement that, it is effective to raise the electron-beam irradiation-scanning speed to n-time speed, i.e., to realize high speed scanning. However, in accordance with reduction of irradiation charge density by the high speed electron beam scanning, the occurrence frequency of secondary electrons and reflection electrons which is generated from the sample is reduced. That is, the frequency of detection of secondary electrons is lowered.

As a method of detecting the secondary electrons and reflection electrons, analog detection and pulse counting are known. The analog detection is used when the detection frequency of the secondary electrons is comparatively high. The secondary electrons are converted into a signal and an average signal intensity is detected. On the other hand, the pulse counting is used when the detection frequency of the secondary electrons is comparatively low. The secondary electrons are converted into a signal and the number of signals corresponding to the number of secondary electrons is detected. In the pulse counting, regarding the reduction of the occurrence frequency of secondary electrons, it is possible to perform detection at a higher signal-to-noise ratio (S/N ratio) than the ratio in the analog detection. It is effective in detection of low-frequency secondary electrons.

When the pulse counting is employed in the electron microscope, it is required to infallibly detect secondary electrons and reflection electrons which are generated at a low frequency to improve visibility of detection image or the like. Especially on the condition of deep groove/hole or high speed scanning, the occurrence frequency of secondary electrons and reflection electrons are lowered extremely. There is a strong demand for improvement in visibility of detection image.

In the pulse counting method described in International Patent Publication WO2013/187511, the secondary electrons are converted into a signal, then the signal intensity is increased or controlled. The signal is detected with an analog-digital converter (hereinbelow, ADC). Further, the appearance frequency of the signal is obtained by peak value of the signal detected in a predetermined period. When the appearance frequency is lower than a previously-stored frequency, the previously-stored value is determined as a threshold value. In this method, when the occurrence frequency of the secondary electrons is lowered, there is a probability of erroneous signal detection with an erroneous threshold value determined when the occurrence frequency of the signal by predetermined period is lowered.

The method described in Japanese Unexamined Patent Application Publication No. Hei 08-062274 detects a signal with a comparator using a variable threshold value and determines a variable threshold value so as to obtain a previously-set number of detection signals. In this method, when the occurrence frequency of secondary electrons is lowered, erroneous signal detection may occur since noise is included in the result of detection. This causes the occurrence of erroneous detection of secondary electrons and degrades visibility of detection image.

In Japanese Unexamined Patent Application Publication No. 2011-175811, the signal yield from the detector is estimated. When it is determined that the yield corresponds to a single signal, image formation is performed by pulse counting. When it is determined that the yield corresponds to multiple signals, image formation is performed by image processing based on the analog method. However, in the pulse counting, there is only a description of determination of brightness gradation based on the sum of values of respective measurement points, with a value of a measurement point exceeding a threshold value between a dark current peak and a single signal peak as 1 and a value equal to or less than the threshold value as 0. There is no concrete description of obtaining a multi-level gradation image.

To solve the above-described problems in the conventional techniques, the present invention provides a charged particle beam apparatus, an image forming method using the charged particle beam apparatus and an image processing apparatus, capable of eliminating a noise component from a detection signal of minute secondary charged particles from a fine pattern to obtain an image with high contrast and high visibility.

To solve the problems, the present invention provides a charged particle beam apparatus including: a charged particle optical system that emits a converged charged particle beam and scans the beam on a surface of a sample; a detection part that detects secondary charged particles which are generated from the sample irradiated with the charged particle beam with the charged particle optical system; an image formation part that receives a detection signal from the detection part and forms an image of the sample; an image processing part that processes the image formed with the image formation part; and a display part that displays the result of processing with the image processing part, wherein the image formation part has a pulse-count signal processing part that generates cumulative histogram information on a pulse signal component in the detection signal from the detection part, sets a threshold value for pulse signal detection using the generated cumulative histogram information, and outputs a detection signal having a value higher than the set threshold value as a pulse signal.

To solve the problems, the present invention provides an image forming method using a charged particle beam apparatus including the steps of: emitting a converged charged particle beam and scanning the beam on a surface of a sample with a charged particle optical system; detecting, with a detection part, secondary charged particles which are generated from the sample irradiated with the charged particle beam with the charged particle optical system; receiving a detection signal from the detection part and forming an image of the sample with an image formation part; processing the image formed with the image formation part by an image processing part; and displaying the result of processing with the image processing part by a display part, wherein the step of forming an image of the sample including: generating cumulative histogram information of a pulse signal component in a detection signal from the detection part; setting a threshold value for pulse signal detection using the generated cumulative histogram information; extracting a detection signal having a value higher than the set threshold value as a pulse signal; and forming an image based on the pulse signal component using the information on the extracted pulse signal.

To solve the problems, the present invention provides an image processing apparatus for forming an image of a sample and receiving a signal from a detection part that detects secondary charged particles, occurring from the sample by emitting a charged particle beam converged with a charged particle beam apparatus on a surface of the sample and scanning the beam, the image processing apparatus including: a pulse-count signal processing part that generates cumulative histogram information on a pulse signal component in the detection signal from the detection part, sets a threshold value for pulse signal detection using the generated cumulative histogram information, and outputs a detection signal having a value higher than the set threshold value as a pulse signal; and a pulse-count image formation part that forms an image based on the pulse signal component using pulse signal information outputted from the pulse-count signal processing part.

According to the typical aspect of the present invention, it is possible to obtain a measurement/inspection image with high visibility with the measuring/inspection apparatus.

These features and advantages of the invention will be apparent from the following more particular description of preferred embodiments of the invention, as illustrated in the accompanying drawings.

BRIEF DESCRIPTION OF THE DRAWINGS

FIG. 1 is a block diagram showing a schematic configuration of a charged particle beam apparatus according to a first embodiment of the present invention;

FIG. 2 is a block diagram showing a schematic configuration of a secondary-electron detection signal processing part of the charged particle beam apparatus according to the first embodiment;

FIG. 3A is a flowchart showing the flow of processing to set a discrimination threshold value and obtain an inspection/measurement image in the charged particle beam apparatus according to the first embodiment;

FIG. 7 is a block diagram showing a schematic configuration of the secondary-electron detection signal processing part in the charged particle beam apparatus according to a second embodiment of the present invention;

FIG. 8B is a data table of the discrimination threshold voltage used in the processing to set the discrimination threshold value and obtain the inspection/measurement image in the charged particle beam apparatus according to the second embodiment;

FIG. 8C is a data table of a gain voltage used in processing to set the gain of the detector and obtain the inspection/measurement image in the charged particle beam apparatus according to the second embodiment; and FIG. 9 is a cumulative histogram showing the relation between the discrimination threshold voltage and the detection signal count number when the gain of the detector is changed in the charged particle beam apparatus according to the second embodiment.

DESCRIPTION OF THE PREFERRED EMBODIMENTS

Figures 3B, 4:
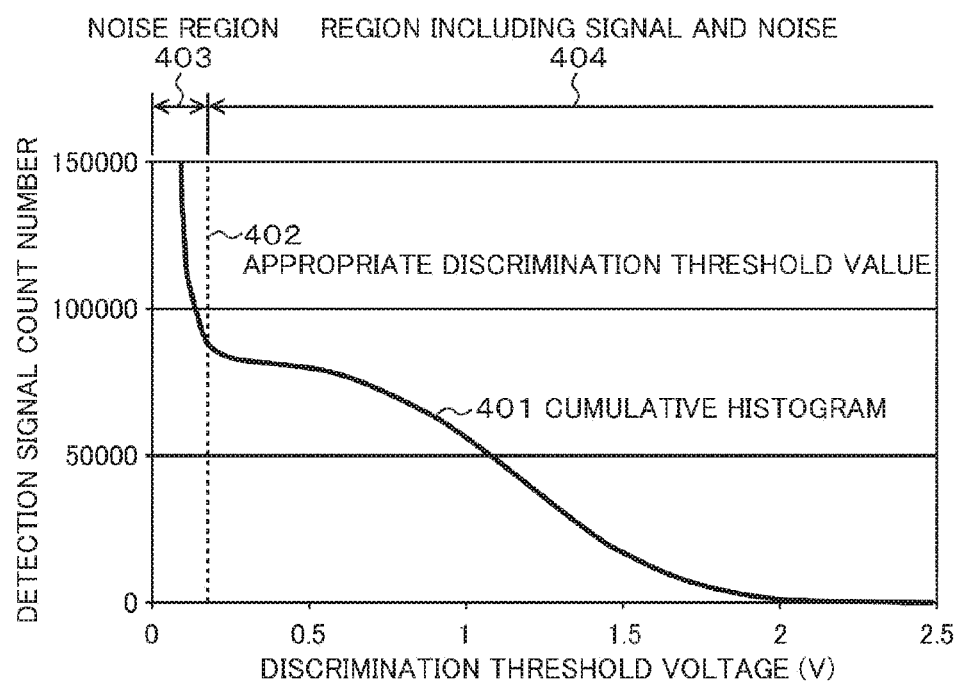
FIG. 3B is a data table of a discrimination threshold voltage used in the processing to set the discrimination threshold value and obtain the inspection/measurement image in the charged particle beam apparatus according to the first embodiment.
FIG. 4 is a graph showing the relation between the discrimination threshold voltage and a detection signal count number in the charged particle beam apparatus according to the first embodiment.

In the present invention, the surface of a sample where a fine pattern is formed is irradiated with a charged particle beam and scanned, and secondary charged particles which are generated from the sample are detected to obtain a secondary charged particle image of the sample. At this time, a noise component is eliminated from a minute secondary charged particle detection signal from the fine pattern, so as to obtain an image with high contrast and high visibility.

Hereinbelow, preferred embodiments of the present invention will be described using the drawings. Note that in all the figures for explanation of the embodiments, the same elements basically have the same reference numerals and the repetitive explanations will be omitted. Note that a measurement/observation/inspection apparatus and a measurement/observation/inspection method are used in any one or a combination of measurement, observation and inspection.

First Embodiment

The present invention is applicable to apparatuses using an electron beam and apparatuses using an ion beam as a charged particle beam apparatus. FIG. 1 shows, as an example of the charged particle beam apparatus, an example (schematic view) of a measurement/observation/inspection system using a scanning electron microscope (SEM). A measurement/observation/inspection system 1000 according to the present embodiment has a scanning electron microscope 100, a secondary-electron detection signal processing part 113, a signal processing/image formation block 115, and a computer 120.

The scanning electron microscope 100 has an electron optical system 110 including a column 150, an electron gun 101 to emit an electron beam 102, a condenser lens 103, a blanking control electrode 104, an aperture 105, a deflector 106, an objective lens 107, and a secondary electron detector 109.

The secondary electron detector 109 detects secondary electrons 108 which are generated from a sample 1 as a subject of measurement/observation/inspection by irradiation with the electron beam 102.

Further, the secondary-electron detection signal processing part 113 processes an output signal from the secondary electron detector 109. The signal processing/image formation block 115 receives an output signal from the secondary-electron detection signal processing part 113, and forms an image. Further, the computer 120 inputs an output signal 116 from the signal processing/image formation block 115, and performs any of the measurement, observation and inspection, or image processing by combination of the measurement, observation and inspection, on the sample 1. The computer 120 displays the result of any of the measurement, observation or inspection or the image processing, as a measurement/observation/inspection image 121, on a user interface screen 122.

Further, the electron gun 101, the condenser lens 103, the blanking control electrode 104, the aperture 105, the deflector 106, the objective lens 107, and the secondary electron detector 109 in the scanning electron microscope 100 are arranged in the column 150. The inside of the column 150 is evacuated to vacuum state with a vacuum evacuation unit (not shown).

The measurement/observation/inspection system 1000 according to the present embodiment processes a signal indicating detection of the secondary electrons 108 which are generated from the sample 1 irradiated with the electron beam 102, and performs measurement/observation/inspection on the sample 1, in a state where the occurrence frequency of the secondary electrons 108 is low to a state where the occurrence frequency of the secondary electrons 108 is high. In the present embodiment, a configuration to determine a threshold value for discrimination between a signal and noise in a state where the occurrence frequency of the secondary electrons is low, e.g. the electron beam 102 is scanned at a high speed on an extremely fine pattern formed on the sample 1 and image pickup is performed, will be described. Note that the detailed explanation of a configuration for analog signal processing to detect the secondary electrons 108 in a state where the occurrence frequency is high and perform image formation from signal intensity of the secondary electrons using an integration value per pixel will be omitted.

In the configuration shown in FIG. 1, the electron gun 101 emits the beam 102 as a primary electron beam. The condenser lens 103 is a focusing lens which focuses the beam 102 emitted from the electron gun 101.

The blanking control electrode 104 is used when blocking of irradiation with the beam 102 on the sample 1 is ON/OFF controlled. Generally, when the blocking is OFF, the beam passes between the blanking control electrodes 104 and through the aperture 105 like the beam 102. When the blocking is ON, the beam is bent between the blanking control electrodes 104, and the beam 102 is emitted on the aperture 105, then emission on the sample 1 is blocked. The beam 102 passed through the aperture 105 is deflection-controlled through the deflector 106. That is, the beam 102 is subjected to scan control including deflection control, and through the objective lens 107 and the like, is emitted, while it is scanned, with respect to the sample 1.

Some of the secondary electrons 108 which are generated from the sample 1 irradiated with the electron beam 102 with respect to the sample 1 enter the secondary electron detector 109, then are converted into an electric signal 112, which is outputted from the secondary electron detector 109.

The analog signal detected with the secondary electron detector 109 where the secondary electrons 108 enter is inputted, through current (I)-to-voltage (V) conversion and preamplification with a preamplifier circuit (not shown), into the secondary-electron detection signal processing part 113. In the secondary-electron detection signal processing part 113, through an analog signal detection part 1131 and a pulse-count signal detection part 1132, image information processed with the analog signal detection part 1131 and image information obtained with the pulse-count signal detection part 1132 are combined with the signal processing/image formation block 115.

The image combined with the signal processing/image formation block 115 is sent to the computer 120 and subjected to image processing. When the measurement/observation/inspection system 1000 has a measurement function, a measurement image is formed. Then a size value of the pattern formed on the sample 1 in the image is calculated. Further, when the measurement/observation/inspection system 1000 has an inspection function, an inspection image is formed. Then processing to detect and determine defect(s) in the image is performed.

FIG. 2 shows a configuration of the secondary-electron detection signal processing part 113 according to the present embodiment. The secondary-electron detection signal processing part 113 has a signal separation part 1130 to receive the detection signal, which has been outputted from the secondary electron detector 109 and has been amplified, and separates the detection signal; the analog signal detection part 1131 to process, among the detection signals separated with the signal separation part 1130, a signal indicating detection of secondary electrons, whose occurrence frequency is high and which is continuously detected, as a low-frequency analog signal; and the pulse-count signal detection part 1132 to perform pulse-count signal processing on a detection signal of discretely generated secondary electrons, among the signals separated with the signal separation part 1130, as a high-frequency signal.

The analog signal detection part 1131 performs signal processing of multi-value digitization on the analog signal of the secondary electrons 108, detected in a state where the occurrence frequency of which is high, to form an image. The detailed description of the signal processing of the analog signal detection part 1131 will be omitted.

The pulse-count signal detection part 1132 has a comparator 201 to compare the signal 112 inputted from the secondary electron detector 109 with a discrimination threshold value 205 and output a detection signal 114, a cumulative histogram processing part 202 to generate a control signal 204 from the detection signal 114, and a variable voltage source 203 to generate the discrimination threshold voltage 205 based on the control signal 204 generated with the cumulative histogram processing part 202.

FIG. 3A shows a flowchart for determination of the discrimination threshold value with the secondary-electron detection signal processing part 113. Further, FIG. 4 shows a cumulative histogram 401 indicating the relation between discrimination threshold voltage 205 and a count number of the detection signal 114.

The operation to determine the discrimination threshold value according to the present embodiment will be described using the flowchart of FIG. 3A. First, the scanning electron microscope 100 is operated with the computer 120 to set measurement conditions and a measurement region of the sample 1 (S301). Then a counter i is set to an initial value 0 with the cumulative histogram processing part 202 (S302).

Then a threshold voltage Vth(0) corresponding to the counter value i=0 is read from a table 320 as shown in FIG. 3B stored in a memory (not shown) of the computer 120. The control signal 204 is outputted from the cumulative histogram processing part 202 to the variable voltage source 203 so as to set the threshold voltage Vth(0) as the discrimination threshold value 205 from the variable voltage source 203 (S303).

Next, the deflection part (deflector) 106 is controlled with the computer 120 so as to scan the electron beam 102 in the measurement region of the sample 1. The output signal 112 from the secondary electron detector 109 that has detected the generated secondary electrons 108 is inputted into the comparator 201. In the comparator 201, the signal 112 is compared with the discrimination threshold value 205 set at S303. When the value of the signal 112 is greater than the discrimination threshold value 205, an output 1, while when the value of the signal 112 is less than the discrimination threshold value 205, an output 0, is sequentially detected as the detection signal 114. The detection signal 114 outputted from the comparator 201 is counted with the cumulative histogram processing part 202 (S304). The count number CNT(0) is stored into the memory of the computer 120 (S305).

Next, the counter i is incremented with the cumulative histogram processing part 202 (S306). A threshold voltage Vth(1) corresponding to the counter value i=1 is set as the threshold value from the table 320 as shown in FIG. 3B (S307), and as in the case of S304, the detection signal is counted (S308). Then the count number CNT(1) is stored into the memory (S309). At this time, the operations of the control signal 204, the variable voltage source 203, the discrimination threshold value 205, the electron beam 102, the deflector 106, and the secondary electron detector 109 are the same as those in the above description. In the cumulative histogram processing part 202, the count number CNT(i) is compared with the count number CNT (i−1) (S310). When the result of comparison is equal to or lower than a determination value, the counter is incremented (S306). Then steps S307, S308 and S309 are performed with a different threshold value. When the result of comparison exceeds the determination value, a threshold voltage Vth(i−1) when the counter has been decremented is read from the table 320 in FIG. 3B. The control signal 204 is outputted so as to set the threshold value Vth(i−1) as the discrimination threshold value 205 (S311).

When the threshold values Vth(i−1) and Vth(i) are in a region 404 in which signal and noise are existing in the graph of FIG. 4, the difference between the count number CNT(i−1) and the count number CNT(i) is small. In this case, the result of comparison (ratio) at S310 is equal to or less than the previously-set determination value. The process returns to S306, to perform the steps S307 to S309 with a (i+1) discrimination threshold voltage read from the table 320 in FIG. 3B.

As shown in the table in FIG. 3B, the threshold value Vth(i−1) is greater than the threshold value Vth(i). That is, sequentially increasing the value i is sequentially decreasing the threshold voltage. In the graph of FIG. 4, the count number CNT(i) data is read from the right side toward the left side.

Note that the determination value is set to a value to discriminate the difference between the inclination of the curve of a cumulative histogram 401 in the signal-noise region 404 including signal and noise and the inclination in a noise region 403 in FIG. 4. That is, the determination value is set to a value greater than the ratio between the count number CNT(i−1) and the count number CNT(i) in a position where the curve of the cumulative histogram 401 is maximum in the region 404 in which signal and noise are existing, and less than the ratio between the count number CNT(i−1) and the count number CNT(i) in a position where the curve of the cumulative histogram 401 in the noise region 403 is minimum.

On the other hand, when the threshold value Vth(i−1) is an appropriate discrimination threshold value 402, the count number CNT(i−1) is in the region 404 in which signal and noise are existing, and the count number CNT(i) is in the noise region 403. The difference between the count numbers is large. In this case, since the result of comparison (ratio) at S310 exceeds the set determination value as described above, the process proceeds to S311, to set the threshold value Vth(i−1) as the discrimination threshold value 205.

Thereafter, the deflection part 106 is controlled so as to scan the electron beam 102 in the measurement region of the sample 1. The generated secondary electrons 108 are converted via the secondary electron detector 109 into the signal 112, and the signal is outputted. In the secondary-electron detection signal processing part 113 that inputs the signal 112, the signal 112 is separated with the signal separation part 1130 into a signal 1121 and a signal 1122. The signal 1121 is sent to the analog signal detection part 1131 to process it as a low-frequency signal. The signal 1122 is sent as a high-frequency signal to the pulse-count signal detection part 1132.

The pulse-count signal detection part 1132 inputs the signal 1122 separated with the signal separation part 1130 into the comparator 201. The comparator 201 receives the signal to control a scan position of the electron beam 102 on the sample by the deflection electrode (deflector) 106 operated with the computer 120. And the comparator 201 compares the input signal 1122 with the discrimination threshold value 205 set at S311. When the input signal 1122 is greater than the discrimination threshold value 205, 1 is outputted, while when the input signal 1122 is less than the discrimination threshold value 205, 0 is outputted, as the detection signal 114, to the signal processing/image formation block 115.

Figure 5:
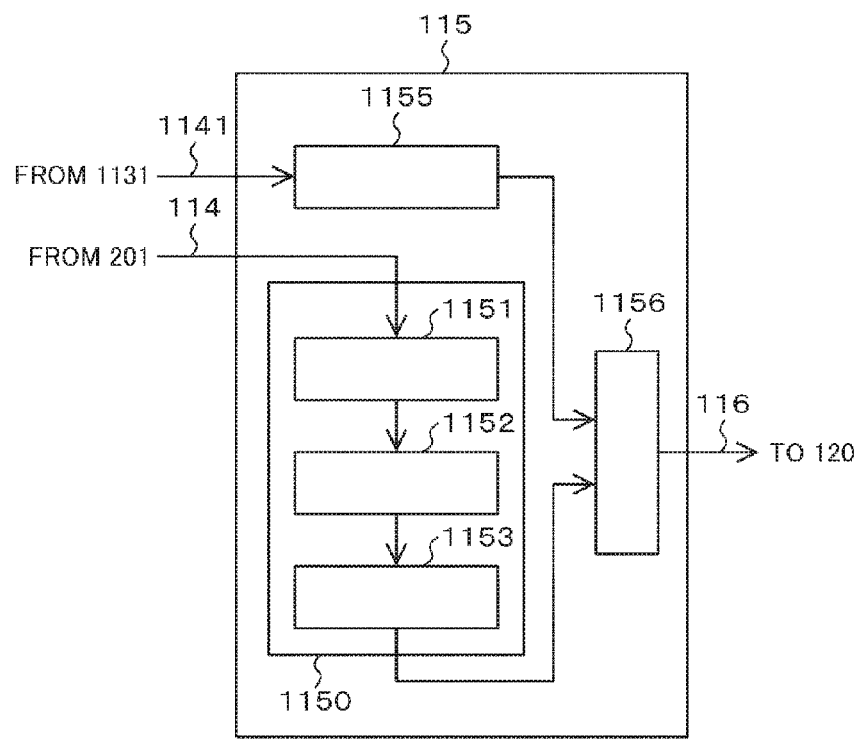
FIG. 5 is a block diagram showing a schematic configuration of a signal processing/image formation block in the charged particle beam apparatus according to the first embodiment.

FIG. 5 shows a configuration of the signal processing/image formation block 115. The signal processing/image formation block 115 has an integrated image formation part 1155, a pulse-count image formation part 1150 and an image combining part 1156. The pulse-count image formation part 1150 has a pulse count part 1151, a brightness gradation generation part 1152 and an image formation part 1153.

Note that when the measurement/observation/inspection system 1000 has a measuring function, it obtains plural frames of images in the same region by repeatedly scanning the electron beam 102 and picking up images plural times in the same region of the surface of the sample 1 in order to improve the contrast of the image of the surface of the sample obtained with the scanning electron microscope 100. In the signal processing/image formation block 115, these plural frames of images are integrated to obtain an image with improved contrast.

When the pulse-count signal detection part 1132 sequentially processes plural frames of images, 1-frame image formed with the signal processing/image formation block 115 based on the 0 or 1 signal outputted from the comparator 201 is a binary image having 0 and 1 values. However, by adding the plural frames of images in the same region, the values in the same region are added, and multi-value image information is obtained.

When a region on the sample 1 where a fine pattern is formed is irradiated with the electron beam 102 and the beam is scanned at a high speed, the amount of secondary electrons which is generated from the sample is small. However, even in such situation, since the secondary electron emission rate has angular dependence, the amount of secondary electrons which are generated from corners (edges) of the fine pattern is larger than that from flat parts. As a result, there is a high probability that an image signal in a position corresponding to an edge of the fine pattern in the one frame image, outputted from the pulse-count signal detection part 1132, becomes 1. Accordingly, when the plural frame images are added, an image where pattern edges are emphasized is obtained.

In the pulse count part 1151, the detection signal 114 outputted from the comparator 201 and the signal to operate the deflection electrode 106 sent from the computer 120 to the comparator 201 are received, and the number of pulses per region is counted in the plural frames. Next, in the brightness gradation generation part 1152, based on the information on the number of pulses counted by region with the pulse count part 1151, brightness gradation corresponding to the count number is generated. Then, in the image formation part 1153, based on the information on the brightness gradation generated with the brightness gradation generation part 1152, a multi-value combined image is formed by pulse-counting using the information on the number of pulses counted by region with the pulse count part 1151. As described above, in the multi-value combined image, the edges of the pattern are emphasized.

On the other hand, in the integrated image formation part 1155, an integrated image is formed by integrating the images of the respective frames, formed based on the secondary-electron detection signal waveform outputted from the secondary electron detector 109 in the analog signal detection part 1131.

In the image combining part 1156, a combined image is formed by combining a multi-value combined image by pulse counting formed in the pulse-count image formation part 1150 with the integrated image formed in the integrated image formation part 1155. The combined image includes the pattern-edge emphasized image components formed in the pulse-count image formation part 1150. In comparison with the integrated image formed in the integrated image formation part 1155, the combined image has higher contrast in the pattern edges. The information on the combined image is transmitted as image information 116 to the computer 120.

The computer 120 displays the image information 116 as the measurement/observation/inspection image 121 on the user interface screen 122. Further, the size of the pattern formed on the sample 1 included in the image information 116 is measured. The result of measurement, and the result of comparison between the result of measurement and a reference value, are displayed on the user interface screen 122. With this series of operations, the inspection/measurement image is obtained (S312). It is possible to set the discrimination threshold value by region by performing the series of operations at S301 by region. Accordingly, the secondary-electron detection signal processing part 113 sets the discrimination threshold value 205 in an appropriate state by measurement condition and measurement region. It is possible to obtain the inspection/measurement image with an appropriate discrimination threshold value.

Figure 6:
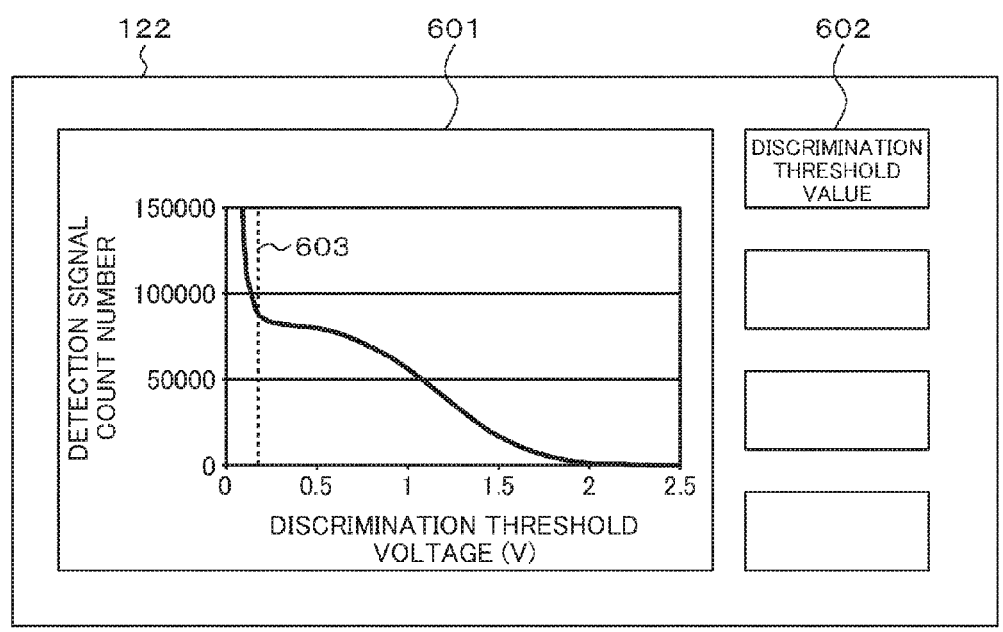
FIG. 6 is a front diagram of a screen of a user interface in the charged particle beam apparatus according to the first embodiment.

FIG. 6 shows a user interface used in a case where the discrimination threshold voltage 205 inputted as a reference signal (REF) for the comparator 201 is adjusted. The discrimination threshold voltage 205 can be automatically set as described above. Further, it can be adjusted by a user in accordance with necessity. To adjust the discrimination threshold voltage, the user adjusts a discrimination threshold value 603 displayed on an operation screen 601 of a user interface 122 with a discrimination threshold adjustment button 602.

The example of signal processing in the processing system to detect and process the secondary electrons 108: the secondary electron detector 109, the secondary-electron detection signal processing part 113, and the signal processing/image formation block 115, is as described above. The configuration and signal processing procedure in a processing system to detect and process reflection electrons: a reflection electron detector, a reflection electron detection signal processing part, and in the signal processing/image formation block, are the same as those in the processing system to detect and process the secondary electrons 108. Accordingly, the detailed description will be omitted.

As described above, according to the present embodiment, in a state where the low-frequency secondary electrons are generated, the secondary-electron detection signal processing part 113 is provided with the pulse-count signal detection part 1132, so as to infallibly discriminate image noise from a pulse signal. With this arrangement, it is possible to suppress non-detection error and erroneous detection of low-frequency secondary electrons and improve the visibility of an inspection/measurement image by setting an appropriate discrimination threshold value 205 by measurement condition and measurement region.

Second Embodiment

In the present embodiment, to suppress non-detection error and erroneous detection of the signal 112 outputted from the secondary electron detector 109, an arrangement to control the secondary electron detector 109 to optimize a peak value of the signal 112 in the configuration shown in FIG. 1 will be described.

FIG. 7 shows a configuration of a secondary-electron detection signal processing part 708. In FIG. 7, for the sake of simplification of explanation, the description of the signal separation part 1130 and the analog signal detection part 1131 described in the configuration in FIG. 2 in the first embodiment is omitted. The secondary-electron detection signal processing part 708 shown in FIG. 7 has a comparator 701 to compare the signal 112 outputted from the secondary electron detector 109 with a discrimination threshold voltage 705 inputted into a reference input terminal (REF) and output a detection signal 709, a cumulative histogram processing part 702 to generate control signals 704 and 710 from the detection signal 709, and a variable voltage source 703 to generate the discrimination threshold voltage 705 from the control signal 704.

Figure 8A:
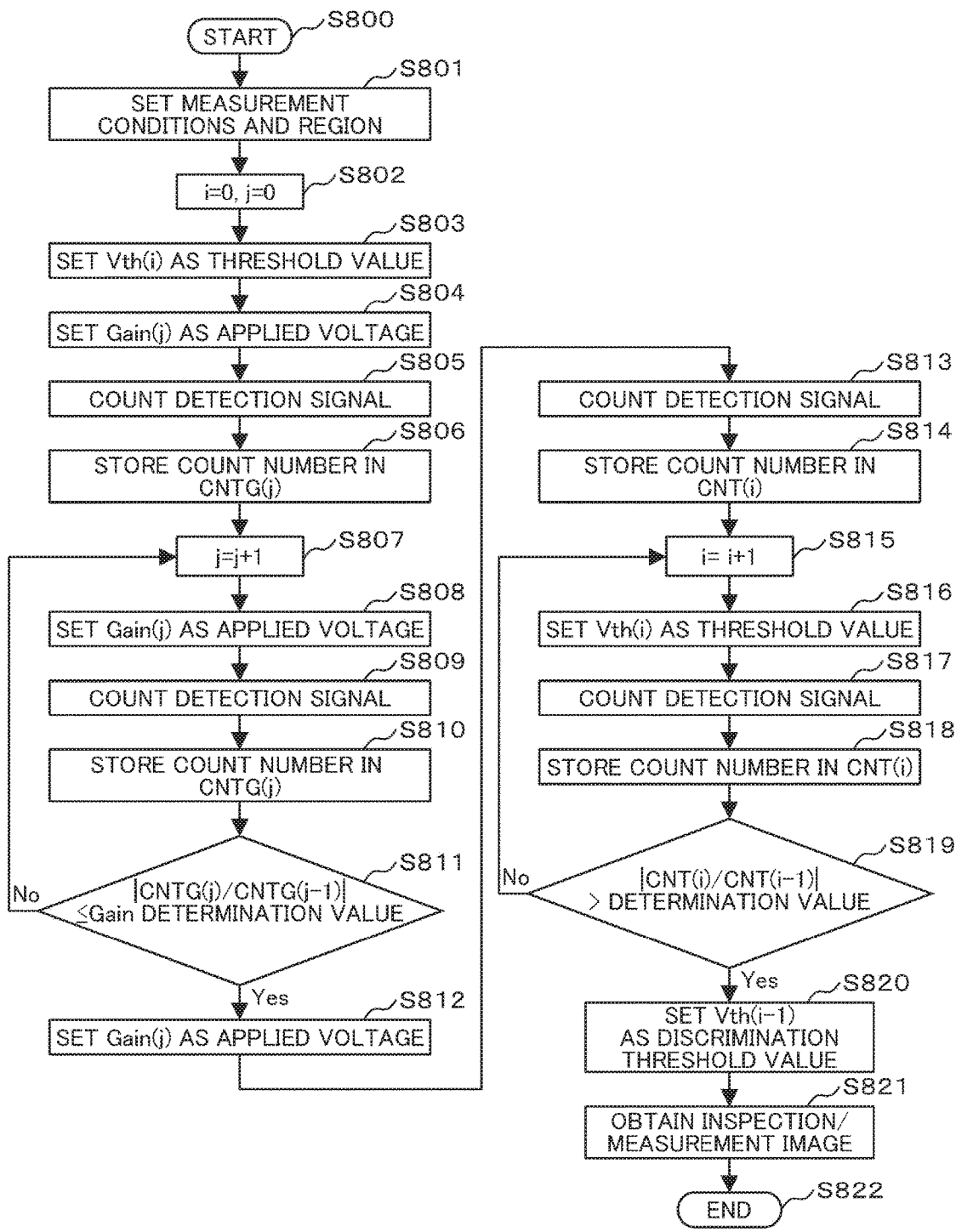
FIG. 8A is a flowchart showing the flow of processing to set a gain of a detector and the discrimination threshold value and obtain the inspection/measurement image in the charged particle beam apparatus according to the second embodiment.

FIG. 8A shows a flowchart of determining the discrimination threshold value when the gain of the secondary electron detector 109 is controlled with the control signal 710 in the present embodiment.

FIG. 9 shows a cumulative histogram showing the relation between the discrimination threshold voltage 705 and the count number of the detection signal 709 when the gain of the secondary electron detector 109 is controlled with the control signal 710 in the present embodiment. A cumulative histogram 902 corresponds to a case where the gain of the secondary electron detector 109 is appropriate. In a portion where the discrimination threshold voltage 705 is low, the count number is large by low-amplitude noise. In a portion where the discrimination threshold voltage 705 is high, the count number is small in accordance with peak value distribution of the signal 112.

On the other hand, a cumulative histogram 901 corresponds to a case where the gain of the secondary electron detector 109 is high. The count number of the detection signal 709 outputted from the comparator 701 is larger than that of the signal 112 inputted into the comparator 701 by amplification of the low-amplitude noise and erroneous detection of the amplified noise with the secondary electron detector 109. When a cumulative histogram 903 corresponds to a case where the gain of the secondary electron detector 109 is low, the signal 112 is not detected due to poor amplification with the secondary electron detector 109, and the count number is small. Accordingly, to suppress non-detection error and erroneous detection of the signal 112, it is necessary to set the gain of the secondary electron detector 109 to an appropriate value.

The operation to determine the discrimination threshold value in the present embodiment will be described along the flowchart of FIG. 8A with reference to FIGS. 1, 7 and 9.

First, the scanning electron microscope 100 is operated with the computer 120 to set the measurement condition and measurement region for the sample 1 (S801). In the cumulative histogram processing part 702, the counters i and j are set to the initial value 0 (S802). Then a threshold voltage Vth(0) corresponding to the counter value i=0 is read from a table 830, shown in FIG. 8B, stored in the memory of the computer 120. The control signal 704 is outputted to set the discrimination threshold voltage 705 to the threshold voltage Vth(0) from the variable voltage source 703 (S803). Apply voltage Gain(0) corresponding to the counter value j=0 is read from a table 831 shown in FIG. 8C stored in the memory. The control signal 710 is outputted to set the voltage Gain(0) as the apply voltage in the secondary electron detector 109 (S804). To count the signal 112 based on the output from the secondary electron detector 109, the deflection part 106 is controlled with the computer 120 to scan the electron beam 102 in the measurement region of the sample 1. The generated secondary electrons 108 are converted via the secondary electron detector 109 into the signal 112, and the signal is inputted into the comparator 701. In the comparator 701, the input signal 112 is compared with the discrimination threshold voltage 705, and detection is performed. The output detection signal 709 is counted with the cumulative histogram processing part 702 (S805). The count number CNTG(0) is stored into the memory (S806).

Next, the counter j is incremented with the cumulative histogram processing part 702 (S807). Then Gain (1) corresponding to the counter value j=1 is set as the apply voltage from the table 831 in FIG. 8C (S808). The detection signal is counted (S809). The counted number CNTG(1) is stored into the memory (S810). At this time, the operations of the control signal 704, the variable voltage source 703, the discrimination threshold voltage 705, the electron beam 102, the deflector 106, and the secondary electron detector 109 are the same as those in the above description. In the cumulative histogram processing part 702, the count number CNTG(j) is compared with the CNTG(j−1) (S811). When the result of comparison is greater than a Gain determination value, the counter is incremented (S807). Then the steps S808, S809 and S810 are performed with a different apply voltage. When the result of comparison is equal to or less than the determination value at S811, the apply voltage Gain (j) is read from the table 831 in FIG. 8C. Then the control signal 710 is outputted to set the Gain(j) as the apply voltage in the secondary electron detector 109 (S812). Further, the flowchart at steps S813 to S822 is the same as that in the first embodiment, accordingly, the explanation of the flowchart will be omitted.

According to the present embodiment, the secondary-electron detection signal processing part 708 can set the peak value of the signal 112 and the discrimination threshold voltage 705 in the secondary-electron detection signal processing part 708 to appropriate state by measurement condition and measurement region. It is possible to obtain an inspection/measurement image with an appropriate discrimination threshold value.

Note that the present invention is not limited to the above-described embodiments but various modifications are included. For example, the above embodiments have been described in detail for explaining the present invention, and the invention is not necessarily limited to an embodiment having all the described constituent elements. Further, a part of constituent elements of an embodiment may be replaced with those of another embodiment. Further, constituent elements of an embodiment may be added to those of another embodiment. Further, it is possible to perform addition/deletion/replacement with respect to a part of constituent elements of the respective embodiments with other constituent elements. Further, a part or all the respective constituent elements, functions, processors and processing parts may be realized with hardware by designing as e.g. an integrated circuit. Further, the respective constituent elements and functions may be realized with software by interpreting and executing a program to realize the respective functions with a processor. The information such as a program, a table and a file to realize the respective functions may be placed in a storage device such as a memory, a hard disk and an SSD (Solid State Drive) or a recording medium such as an IC card, an SD card and a DVD.

What is claimed is:

1. A charged particle beam apparatus comprising:
 a charged particle optical system that emits a converged charged particle beam and scans the beam on a surface of a sample;
 a detection part that detects secondary charged particles which are generated from the sample irradiated with the charged particle beam with the charged particle optical system;
 an image formation part that receives a detection signal from the detection part and forms an image of the sample;
 an image processing part that processes the image formed with the image formation part; and
 a display part that displays the result of processing with the image processing part,
 wherein the image formation part has a pulse-count signal processing part that generates cumulative histogram information on a pulse signal component in the detection signal from the detection part, sets a threshold value for pulse signal detection using the generated cumulative histogram information, and outputs a detection signal having a value higher than the set threshold value as a pulse signal.

2. The charged particle beam apparatus according to claim 1, wherein the image formation part further includes a pulse-count image formation part, and forms an image based on the pulse signal component using pulse signal information outputted from the pulse-count signal processing part.

3. The charged particle beam apparatus according to claim 1, wherein the image formation part has:
 a pulse count part that counts the number of pulses in corresponding positions of plurality of frames from the pulse signal information for the plurality of frames outputted from the pulse-count signal processing part, when the charged particle optical system repeatedly emitting the converged charged particle beam and scanning the beam in a predetermined region of the surface of the sample a plurality of times;

a brightness gradation setting part that sets brightness gradation of the image from information on the number of pulses counted with the pulse count part; and an image formation part that forms an image using the information on the number of pulses by each position of the plurality of frames counted with the pulse count part and the information on the brightness gradation of the image set with the brightness gradation setting part.

4. The charged particle beam apparatus according to claim 1, wherein the image formation part further has:

an analog signal detection part that processes a signal of a low frequency component in the detection signal from the detection part and forms an image; and an integrated image combining part that integrates the images formed with the analog signal detection part.

5. The charged particle beam apparatus according to claim 1, wherein the image processing part processes the image formed with the image formation part, to measure the size of a pattern formed on the sample, and the display part displays information on the size of the pattern measured with the image processing part.

6. An image forming method using a charged particle beam apparatus including the steps of:

emitting a converged charged particle beam and scanning the beam on a surface of a sample with a charged particle optical system;

detecting, with a detection part, secondary charged particles which are generated from the sample irradiated with the charged particle beam with the charged particle optical system;

receiving a detection signal from the detection part and forming an image of the sample with an image formation part;

processing the image formed with the image formation part by an image processing part; and displaying the result of processing with the image processing part by a display part, wherein the step of forming an image of the sample including:

generating cumulative histogram information of a pulse signal component in a detection signal from the detection part;

setting a threshold value for pulse signal detection using the generated cumulative histogram information;

extracting a detection signal having a value higher than the set threshold value as a pulse signal; and forming an image based on the pulse signal component using the information on the extracted pulse signal.

7. The image forming method using the charged particle beam apparatus according to claim 6, wherein the image formation based on the pulse signal component is performed by:

counting the number of pulses in corresponding positions of a plurality of frames from pulse signal information for the plurality of frames obtained by repeatedly emitting the converged charged particle beam and scanning the beam in a predetermined region of the surface of the sample a plurality of times with the charged particle optical system;

setting brightness gradation of the image from information on the counted number of pulses; and forming an image using the information on the number of pulses by each position of the plurality of frames and the information on the set brightness gradation of the image.

8. The image forming method using the charged particle beam apparatus according to claim 6, wherein the image formation with the image formation part further includes:

processing a signal of a low frequency component in the detection signal from the detection part and forming an image; and combining images by integrating the formed images.

9. The image forming method using the charged particle beam apparatus according to claim 6, wherein the image processing with the image processing part includes:

processing the image formed with the image formation part to measure a size of a pattern formed on the sample; and displaying information on the size of the pattern measured with the image processing part with the display part.

10. An image processing apparatus for forming an image of a sample and receiving a signal from a detection part that detects secondary charged particles, occurring from the sample by emitting a charged particle beam converged with a charged particle beam apparatus on a surface of the sample and scanning the beam, the image processing apparatus comprising:

a pulse-count signal processing part that generates cumulative histogram information on a pulse signal component in the detection signal from the detection part, sets a threshold value for pulse signal detection using the generated cumulative histogram information, and outputs a detection signal having a value higher than the set threshold value as a pulse signal; and a pulse-count image formation part that forms an image based on the pulse signal component using pulse signal information outputted from the pulse-count signal processing part.

11. The image processing apparatus according to claim 10, wherein the pulse-count signal processing part has:

a pulse count part that counts the number of pulses in corresponding positions of plurality of frames from the pulse signal information for the plurality of frames outputted from the pulse-count signal processing part, when the charged particle optical system has repeated emission of the converged charged particle beam and scanning the beam in a predetermined region of the surface of the sample a plurality of times;

a brightness gradation setting part that sets brightness gradation of the image from information on the number of pulses counted with the pulse count part; and an image formation part that forms an image using the information on the number of pulses by each position of the plurality of frames counted with the pulse count part and the information on the brightness gradation of the image set with the brightness gradation setting part.

12. The image processing apparatus according to claim 10, wherein the image formation part further has:

an analog signal detection part that processes a signal of a low frequency component in the detection signal from the detection part and forms an image; and an integrated image combining part that integrates the images formed with the analog signal detection part.

13. The image processing apparatus according to claim 10, further comprising an image processing part that processes the image formed with the image formation part to measure the size of a pattern formed on the sample, and display information on the size of the pattern measured with the image processing part, with the display part.

* * * * *